United States Patent
Kim et al.

(10) Patent No.: US 7,254,031 B2
(45) Date of Patent: Aug. 7, 2007

(54) DISPLAY APPARATUS HAVING HEAT DISSIPATING STRUCTURE FOR DRIVER INTEGRATED CIRCUIT

(75) Inventors: Ki-Jung Kim, Suwon-si (KR); Tae-Kyoung Kang, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 90 days.

(21) Appl. No.: 11/128,582

(22) Filed: May 12, 2005

(65) Prior Publication Data

US 2005/0259039 A1    Nov. 24, 2005

(30) Foreign Application Priority Data

May 20, 2004 (KR) .................. 10-2004-0035923

(51) Int. Cl.
    *H05K 7/20* (2006.01)
(52) U.S. Cl. .............. 361/717; 361/681; 361/704; 361/705; 361/706; 361/707; 313/46; 313/498; 313/582; 313/583; 345/60; 349/58; 349/150
(58) Field of Classification Search ............ 361/681, 361/687, 704, 707, 714, 719, 808, 809, 825, 361/831, 760, 767, 785, 789, 796, 799; 174/51, 174/68.1, 254; 349/58, 150, 151, 56, 60; 345/204–206, 60, 87, 104, 74, 80; 315/169.4; 313/587
See application file for complete search history.

(56) References Cited

U.S. PATENT DOCUMENTS 5,130,832 A * 7/1992 Kawaguchi et al. .......... 349/56
5,529,863 A * 6/1996 Swirbel et al. ............... 430/20
6,275,220 B1 * 8/2001 Nitta ........................... 345/204
6,366,264 B1 * 4/2002 Kurumada .................... 345/60
6,522,543 B2 * 2/2003 Kurihara et al. ............. 361/704
6,534,722 B2 * 3/2003 Takaoka ....................... 174/254

(Continued)

FOREIGN PATENT DOCUMENTS

KR      2000-0062936      10/2000

OTHER PUBLICATIONS

Patent Abstracts of Korea for Publication No. 2000-0062936; Date of publication of application Oct. 25, 2000, in the name of Nitta Hideto.

*Primary Examiner*—Michael Datskovskiy
(74) *Attorney, Agent, or Firm*—Christie, Parker & Hale, LLP

(57) ABSTRACT

A display apparatus having a heat dissipating structure for a driver integrated circuit is provided. The display apparatus may be a plasma display apparatus including a chassis base, a plasma display panel (PDP) adjacent to a first side of the chassis base, and a driving circuit board attached on a second side of the chassis base, the second side being opposite to the first side where the PDP is attached. The plasma display apparatus also includes a driver integrated circuit (IC) electrically connected to electrodes of the PDP and the driving circuit board at a position therebetween, the driver IC selectively providing a voltage to the electrodes of the PDP in accordance with signals controlled by the driving circuit board. The plasma display apparatus also has a heat dissipation unit positioned at the edge of the PDP wherein the heat dissipation unit dissipates heat from the driver IC.

16 Claims, 3 Drawing Sheets

U.S. PATENT DOCUMENTS 6,597,113 B1 * 7/2003 Nitta .......................... 313/581
6,774,872 B1 * 8/2004 Kawada et al. ............... 345/60
6,972,963 B1 * 12/2005 Chou ........................ 361/760
7,115,980 B2 * 10/2006 Miyagawa et al. ......... 257/678
2006/0098412 A1 * 5/2006 Kim et al. ................... 361/704
2006/0181853 A1 * 8/2006 Jeong ......................... 361/704
2006/0187641 A1 * 8/2006 Shin ........................... 361/704

* cited by examiner

DISPLAY APPARATUS HAVING HEAT DISSIPATING STRUCTURE FOR DRIVER INTEGRATED CIRCUIT

CROSS REFERENCE TO RELATED APPLICATION

This application claims priority to and the benefit of Korean Patent Application No. 10-2004-0035923 filed on May 20, 2004, in the Korean Intellectual Property Office, the entire content of which is incorporated herein by reference.

BACKGROUND OF THE INVENTION

1. Field of the Invention

The present invention relates to a display apparatus and, in particular, to a plasma display apparatus having a heat dissipating structure for a driver integrated circuit.

2. Description of the Related Art

There are many display devices available today. One such display device is a plasma display device. It is well known that a plasma display apparatus uses plasma generated by gas discharge to produce an image on a plasma display panel (PDP). In the plasma display apparatus, electrodes printed on the PDP are connected electrically to a driving circuit, and a driver integrated circuit (IC) provides the electrodes with an address voltage in accordance with signals controlled by the driving circuit.

Exemplary structures using a driver IC to provide the voltage are a chip on board (COB), in which the driver IC is installed on a printed circuit board (PCB), and a chip on film (COF), in which the driver IC is installed on a film composing a flexible printed circuit (FPC). Other exemplary structures used to provide the voltage are a tape carrier package (TCP) in which the driver IC is packaged in a tape shape, and a chip on glass (COG), in which the driver IC is installed directly on the glass substrate of the PDP.

The COG-type has an advantage of reducing the size of the PDP because the driver IC is on a glass substrate of the PDP and electrically connects the electrodes formed on the glass substrate to the terminals of the FPC.

However, the COG-type driver IC produces a large amount of heat. This is partially due to gas discharge occurring at least 8 times in 1/60 second (1 TV field) which generates more than 256 gradations in the PDP. As a result, the heat may cause breakdown of the driver IC and degradation in the picture quality due to image sticking resulting from phosphor degradation by the heat.

SUMMARY OF THE INVENTION

In accordance with the present invention, a display apparatus is provided in which a heat dissipating structure for a driver IC is installed to dissipate heat efficiently from a COG-type driver IC.

In one embodiment of the present invention, the display apparatus is a plasma display apparatus. The plasma display apparatus may include: a chassis base; a PDP adjacent to a first side of the chassis base; a driving circuit board attached on a second side of the chassis base, the second side being opposite to the first side where the PDP is attached; a driver IC, electrically connected to electrodes of the PDP and the driving circuit board at a position therebetween, the driver IC selectively providing a voltage to the electrodes of the PDP in accordance with signals controlled by the driving circuit board; and a heat dissipation unit, positioned at the edge of the PDP, dissipating heat from the driver IC.

The electrodes of the PDP may be address electrodes.

In one exemplary embodiment, a COG type driver IC is bonded on the edge of the PDP and is electrically connected to the electrode terminals of the PDP via an FPC.

In a further embodiment, the heat dissipation unit may include a thermally conductive metallic pattern placed along an edge of the PDP.

The thermally conductive metallic pattern may be made of silver. Also, copper or chromium, or a multi-layer of chrome-copper-chrome may be used for the thermally conductive metallic pattern.

The heat dissipation unit may include a heat sink installed in contact with each of the lengthwise end portions of the thermally conductive metallic pattern.

A further embodiment of the present invention may include an electrical insulation layer formed on both the electrode terminals of the PDP connected to the driver IC and the connecting terminals of the FPC connected to the driver IC.

Alternatively, the electrical insulation layer may be formed on the driver IC as well as on both the electrode terminals of the PDP connected to the driver IC and the connecting terminals of the FPC connected to the driver IC.

The electrical insulation layer may be made of a silicone resin or an epoxy resin.

DETAILED DESCRIPTION

Figure 1:
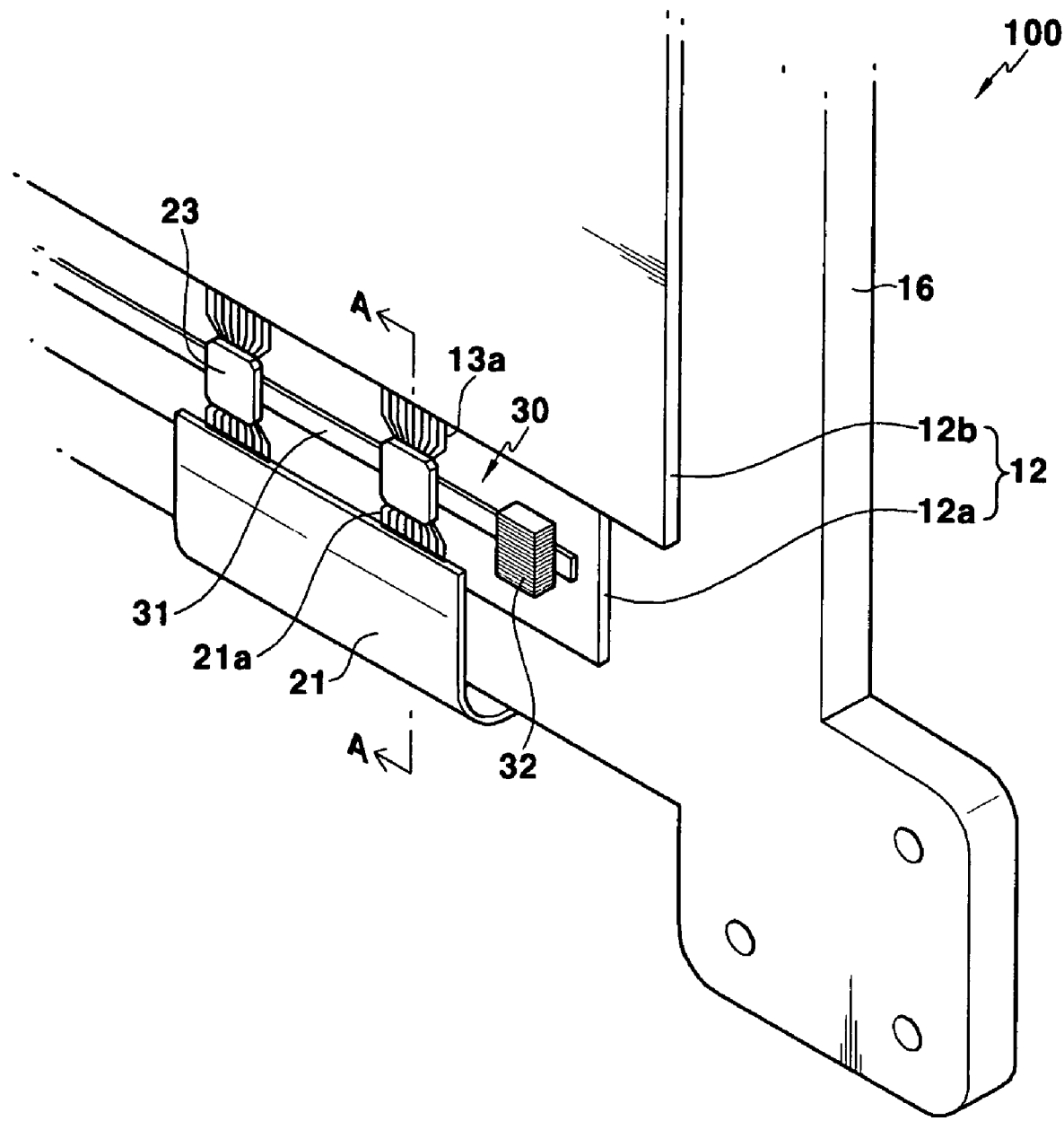
FIG. 1 is a partial perspective view of a plasma display apparatus having a heat dissipation structure for a driver IC according to an embodiment of the present invention.
Figure 2:
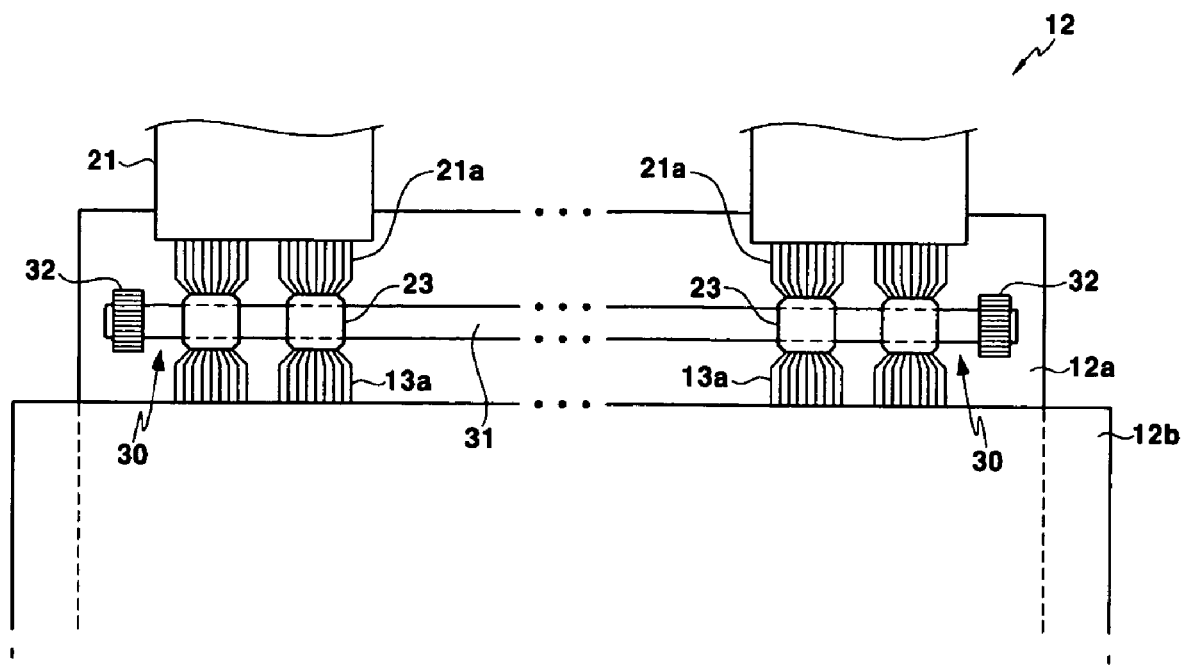
FIG. 2 is a partial plan view of the plasma display apparatus of FIG. 1.

As shown in the drawings, a plasma display apparatus 100 in accordance with an embodiment of the present invention includes a PDP 12 and a chassis base 16 supporting the PDP 12. The PDP 12 is attached to one side of the chassis base 16, and a driving circuit board 18 (FIG. 3) for driving the PDP 12 is attached to the other side of the chassis base 16.

The PDP 12 has electrodes 13 (FIG. 3), which may be address electrodes, for receiving signals to drive an image display, the electrodes 13 being pulled out to the edge of the PDP 12. Specifically, the PDP 12 includes a first substrate 12a (hereinafter referred to as a rear substrate) having the electrodes 13 and a second substrate 12b having display electrodes (not shown).

A front cover (not shown) is placed over the PDP 12, and a back cover (not shown) is placed over the chassis base 16. All of the components are assembled into a plasma display apparatus set.

The electrodes 13 for receiving signals for driving the PDP 12 are pulled out to the edge of the PDP 12, for example to the bottom edge of the rear substrate 12a (as shown in the drawing), and are electrically connected to the driving circuit board 18 via a flexible printed circuit (FPC) 21.

A plurality of driver ICs 23 are installed between the PDP 12 and the driving circuit board 18 and serve to selectively provide a voltage to the electrodes 13 in accordance with the signals controlled by the driving circuit board 18.

In one exemplary embodiment, the driver IC 23 may be installed as a conventional chip on glass (COG) type on the edge of the rear substrate 12a and may be connected to the driving circuit board 18 via the FPC 21.

Figure 3:
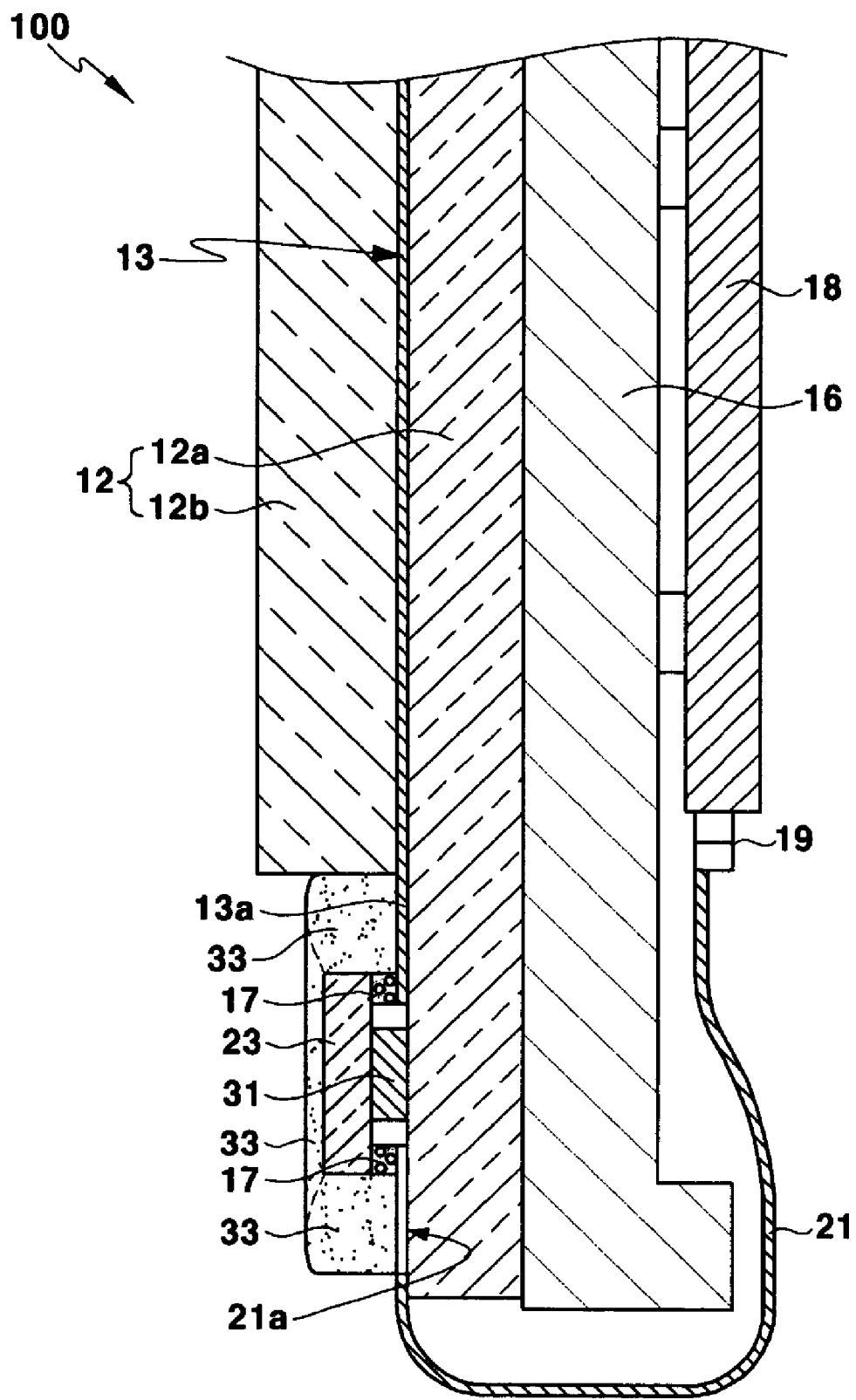
FIG. 3 is a partial side cross-sectional view taken along section line A-A of FIG. 1.

Specifically as shown in FIG. 3, the driver IC 23 is electrically connected by a conventional anisotropic conductive film (ACF) 17 both to the electrode terminals 13a of the electrodes 13 pulled out to the edge of the rear substrate 12a and to the connecting terminals 21a at one end of the FPC 21. The other end of the FPC 21 may be electrically connected to the driving circuit board 18 by a conventional connector 19.

During the operation of the plasma display apparatus 100 in accordance with an embodiment the present invention, the address discharge under the address voltage of about 75 volts occurs at least 8 times in 1/60 second (1 TV field) thereby generating more than 256 gradations in the PDP 12. Therefore, the driver IC 23 generates a large amount of heat caused by switching the electrodes 13 on and off.

As shown in the drawings, the plasma display apparatus 100 of the present embodiment includes a heat dissipation unit 30 to lower the temperature of the driver IC 23 by dissipating heat efficiently from the driver IC 23.

The heat dissipation unit 30 includes a thermally conductive metallic pattern 31 extending along the edge of the rear substrate 12a to substantially contact the driver IC 23.

The thermally conductive metallic pattern 31 may be formed in a line shape with a predetermined length and width along the edge of the rear substrate 12a so as not to be electrically connected to either the electrode terminals 13a of the electrodes 13 or to the connecting terminals 21a of the FPC 21.

Such a thermally conductive metallic pattern 31 may be formed during the electrode 13 forming process, which consists of printing a silver pattern, drying the pattern, and exposing and/or developing the pattern on the inner surface of the rear substrate 12a. The electrodes 13 and the thermally conductive metallic pattern 31 may be formed at the same time by using a mask pattern corresponding to the electrodes 13 and the thermally conductive metallic pattern 31 in the forming process.

The thermally conductive metallic pattern 31 may be made of a material with a high thermal conductivity, for example silver, that is the same material as the electrode pattern material. As an alternative to silver, the thermally conductive metallic pattern 31 may be made of copper or chromium, or may be formed into a multi-layered structure of chrome-copper-chrome.

The driver IC 23 may be attached to the thermally conductive metallic pattern 31 by means of conventional thermal conductive adhesives, metals with a low melting point, or an ultraviolet ray hardened resin. As a result, according to an embodiment of the present invention, the heat from the driver IC 23 is efficiently spread and dissipated along the thermally conductive metallic pattern 31 due to the high thermal conductivity of the composing material, for example, silver.

Furthermore, the heat dissipation unit 30 of an embodiment of the present invention may include a heat sink 32 installed at each of the end portions of the thermally conductive metallic pattern 31 for efficient dissipation of the heat from the thermally conductive metallic pattern 31 and the driver IC 23. The heat sink 32 may be a conventional heat sink having a plurality of heat dissipation fins and may be attached to the thermally conductive metallic pattern 31 in the same way as the driver IC 23. The heat sink 32 serves to substantially increase the air contact area with the thermally conductive metallic pattern 31 and leads to enhancement of the heat dissipation rate from the driver IC 23.

An embodiment of the present invention has the structure of a COG-type driver IC 23 installed at the edge of the rear substrate 12a for providing a voltage. The driver IC 23 is attached on the thermally conductive metallic pattern 31 so that the heat from the driver IC generated during the operation of the plasma display apparatus 100 is easily dissipated by the thermally conductive metallic pattern and the heat sink 32. As a result, the temperature of the driver IC 23 is effectively lowered.

According to an embodiment of the present embodiment, as shown in FIG. 3, in the connecting area where the driver IC 23 is connected both to the electrodes 13 and to the FPC 21, an electrical insulation layer 33 which serves to prevent not only the intrusion of moisture and corrosive gases but also the oxidation of the connecting area is formed. The electrical insulation layer 33 may also prevent electrical non-continuity.

The electrical insulation layer 33 may be made of a silicone resin or an epoxy resin having electrical non-conductivity. The electrical insulation layer 33 may cover the electrode terminals 13a and the connecting terminals 21a, but may leave the driver IC 23 and the thermally conductive metallic pattern 31 uncovered, as illustrated in dashed lines in the drawing. If silicone resin is used as the electrical insulation layer 33, the silicone resin may be in a gel-like phase and may be cured naturally after spreading the resin over the electrode terminals 13a and the connecting terminals 21a. If epoxy resin is used for the electrical insulation layer 33, the epoxy resin may also be in a gel-like phase and may be cured by an ultraviolet ray after spreading the resin over the electrode terminals 13a and the connecting terminals 21a.

The electrical insulation layer 33 leaves the driver IC 23 and the thermally conductive metallic pattern 31 uncovered so as to expose the driver IC 23 externally for easy maintenance. However, the present invention is not limited to this case and may include an embodiment where the electrical insulation layer 33 covers the entire driver IC 23 as well as the electrode terminals 13a and the connecting terminals 21a as shown in the drawing.

Although one embodiment describes address electrodes as an example of the electrodes 13 pulled out to the edge of the rear substrate 12a, the present invention may be applied to scan electrodes to provide scan pulse signals.

As explained hereinabove, an exemplary plasma display apparatus of the present invention has a structure of a COG-type driver IC installed on a substrate of the PDP for providing the voltage, and can dissipate heat effectively from the driver IC by means of the heat dissipation unit. Therefore, reliability of the product is improved because the rate of breakdown of the driver IC due to heat is decreased, and degradation in picture quality is also decreased.

Although exemplary embodiments of the present invention have been described in detail hereinabove, it should be understood that many variations and/or modifications of the basic inventive concept taught therein will still fall within the spirit and scope of the present invention, as defined in the appended claims.

What is claimed is:

1. A display apparatus comprising:
a chassis base;
a display panel adjacent to a first side of the chassis base;
a driving circuit board attached to a second side of the chassis base, the second side being opposite the first side;
a driver integrated circuit electrically connected to electrodes of the display panel and to the driving circuit board at a position between the electrodes and the driving circuit board, the driver integrated circuit selectively providing a voltage to the electrodes of the plasma display panel in accordance with signals controlled by the driving circuit board; and a heat dissipation unit positioned adjacent an edge of the display panel, wherein the heat dissipation unit dissipates heat from the driver integrated circuit, the heat dissipating unit including a thermally conductive metallic pattern and at least one heat sink located adjacent to at least one lengthwise end portion of the thermally conductive metallic pattern.

2. The display apparatus of claim 1, wherein the driver integrated circuit is a chip on glass type;

wherein the driver integrated circuit is bonded on the edge of the display panel; and wherein the driver integrated circuit is electrically connected to electrode terminals of the display panel via a flexible printed circuit.

3. The display apparatus of claim 1, wherein the thermally conductive metallic pattern is made of silver.

4. The display apparatus of claim 1, wherein the thermally conductive metallic pattern is made of one of the group consisting of copper and chromium.

5. The display apparatus of claim 1, wherein the heat dissipation unit further comprises a heat sink in contact with each of lengthwise end portions of the thermally conductive metallic pattern.

6. The display apparatus of claim 2, wherein an electrical insulation layer is formed on both the electrode terminals of the display panel connected to the driver integrated circuit and on the connecting terminals of the flexible printed circuit connected to the driver integrated circuit.

7. The display apparatus of claim 6, wherein the electrical insulation layer is made of one of the group consisting of a silicone resin and an epoxy resin.

8. The display apparatus of claim 1, wherein an electrical insulation layer is formed on the driver integrated circuit as well as on both electrode terminals of the display panel connected to the driver integrated circuit and the connecting terminals of a flexible printed circuit connected to the driver integrated circuit.

9. The display apparatus of claim 8, wherein the electrical insulation layer is made of one of the group consisting of a silicone resin and an epoxy resin.

10. The display apparatus of claim 1, wherein the electrodes of the display panel are address electrodes.

11. The display apparatus of claim 1, wherein the display panel is a plasma display panel.

12. A heat dissipation unit for a chip on glass driver integrated circuit mounted on a substrate comprising:

a thermally conductive metal pattern formed along an edge of the substrate, the thermally conductive metal pattern contacting the chip on glass driver integrated circuit and being electrically isolated from any electrode terminals; and at least one heat sink located adjacent to at least one end portion of the thermally conductive metal pattern.

13. The heat dissipation unit of claim 12, wherein the thermally conductive metal pattern is formed in a line shape.

14. The heat dissipation unit of claim 12, further comprising two heat sinks, each heat sink located adjacent to one end portion of the thermally conductive metal pattern.

15. The heat dissipation unit of claim 12, wherein the thermally conductive metal pattern is made of a material with high thermal conductivity.

16. The heat dissipation unit of claim 15, wherein the material is selected from one of the group consisting of silver, copper and chromium.

* * * * *